United States Patent [19]

Sooch

[11] Patent Number: 5,245,344

[45] Date of Patent: Sep. 14, 1993

[54] HIGH ORDER SWITCHED-CAPACITOR FILTER WITH DAC INPUT

[75] Inventor: Navdeep S. Sooch, Austin, Tex.

[73] Assignee: Crystal Semiconductor, Austin, Tex.

[21] Appl. No.: 641,183

[22] Filed: Jan. 15, 1991

[51] Int. Cl.$^5$ ............................................. H03M 3/02
[52] U.S. Cl. .................................... 341/150; 341/143; 375/28
[58] Field of Search ................ 341/118, 120, 121, 143, 341/144, 150, 153, 154, 128, 126, 172; 375/27, 28, 33

[56] References Cited

U.S. PATENT DOCUMENTS

| | | | |
|---|---|---|---|
| 4,851,841 | 7/1989 | Sooch | 341/143 |
| 4,872,011 | 10/1989 | Pelgrom et al. | 341/150 |
| 4,924,511 | 5/1990 | Burns et al. | 379/418 |
| 5,012,245 | 4/1991 | Scott et al. | 341/150 |

Primary Examiner—A. D. Pellinen
Assistant Examiner—Brian K. Young
Attorney, Agent, or Firm—Gregory M. Howison

[57] ABSTRACT

A digital-to-analog converter includes a delta-sigma modulator (10) that receives a digital input and converts it to a one-bit digital output stream. A fourth order switched-capacitor filter (12) is operable to receive the one-bit digital stream and convert it to an analog value in the sampled data domain. This is input to a switched-capacitor/continuous time buffer (14) which is then filtered by an active low pass filter (18) to provide an analog output. The switched-capacitor filter (12) includes four stages of integration (24), (30), (34) and (38). A one-bit DAC (20) is provided for converting the one-bit digital stream to an analog value. The one-bit DAC (20) is integral with the first stage of integration and is summed by a summing junction (22) with the output of the forth stage of integration (38). In this manner, the first stage of integration (24) is operable to influence or reduce the noise output by the fourth stage of integration (38), thus resulting in a low noise high order switched-capacitor filter.

18 Claims, 5 Drawing Sheets

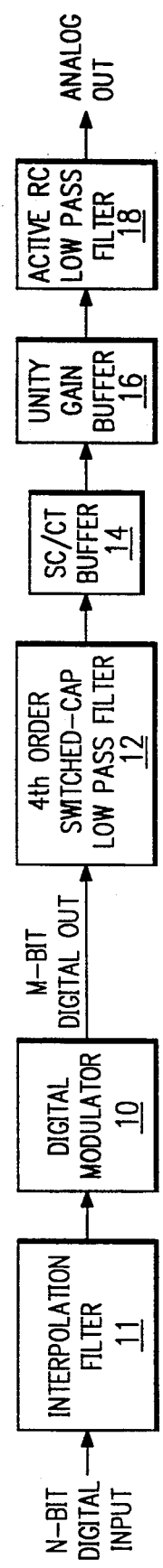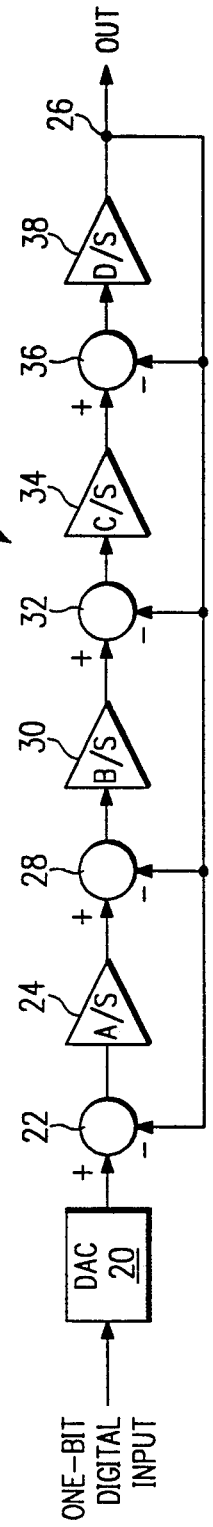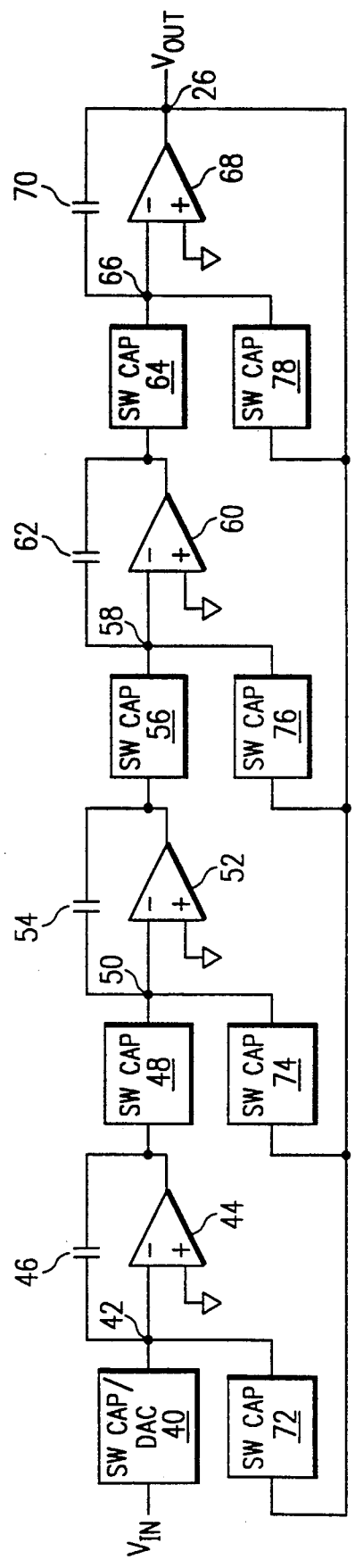

HIGH ORDER SWITCHED-CAPACITOR FILTER WITH DAC INPUT

TECHNICAL FIELD OF THE INVENTION

The present invention pertains in general to switched-capacitor filters, and more particularly, to a digital-to-analog converter utilizing a delta-sigma digital modulator and switched-capacitor filter.

CROSS-REFERENCE TO RELATED APPLICATION

This application is co-pending with U.S. patent application Ser. No. 07/641,876, entitled, "Switched-Capacitor to Continuous Time Buffer for DAC", now abandoned, U.S. patent application Ser. No. 07/642,280, entitled "Low Distortion Unity Gain Amplifier for DAC" and U.S. patent application No. 07/641,182, entitled "Low Distortion Amplifier Output Stage for DAC".

BACKGROUND OF THE INVENTION

In conventional digital-to-analog converters, a first conversion stage is followed by multiple stages of low-pass filtering to filter out unwanted noise. In one type of digital-to-analog converter, a digital delta-sigma modulator is utilized. The delta-sigma modulator receives a digital input and converts it into a one-bit digital output. This output is typically passed through a one-bit DAC and then into an active RC low pass filter. The active RC low pass filter utilizes a series of resistors and various active components in order to realize the desired filter function. The disadvantage to this type of filter is the sensitivity of the filter to variations in the components. A significant amount of trimming is often required.

In another type of filtering scheme, a switched-capacitor filter has been optimized. However, noise performance of this type of filter has not been utilized to its fullest due to the fact that switched-capacitor filters in DACs utilizing delta-sigma modulators have been realized with cascaded bi-quad switched-capacitor filters. The disadvantage to this is that the multiple bi-quad stages add a significant noise component to the overall filter function, which is undesirable.

SUMMARY OF THE INVENTION

The present invention disclosed and claimed herein comprises a digital-to-analog converter. The digital-to-analog converter includes a digital portion for receiving an n-bit digital word and converting the n-bit digital word to an m-bit digital stream representing the value of a digital word m being less than n. The m-bit digital stream is received by an m-bit DAC and converted to an analog value. An analog portion receives the analog value and filters it to provide a filtered analog value. The analog portion includes a switched-capacitor filter having greater than two stages of integration. The noise of at least a succeeding stage above order two in the switched-capacitor filter has the noise thereof influenced by the input stage to the switched-capacitor filter.

In another aspect of the present invention, m has a value of "one" and the digital portion includes a delta-sigma digital modulator for outputting a one-bit digital stream having a one's density proportional to the input n-bit digital value. The one-bit digital stream is input to a one-bit digital-to-analog converter, which is integral with the input stage of a switched-capacitor filter. The switched-capacitor filter includes at least four stages of integration with the output of the fourth stage summed with the output of the first stage. In this manner, the first stage reduces the noise output by the fourth stage.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates an overall block diagram of a low noise/low distortion switched-capacitor/continuous time filter;

FIG. 2 illustrates a logic block diagram of the switched-capacitor filter;

FIG. 3 illustrates a more detailed block diagram of the switched-capacitor filter of FIG. 2;

DETAILED DESCRIPTION OF THE INVENTION

Figure 4:
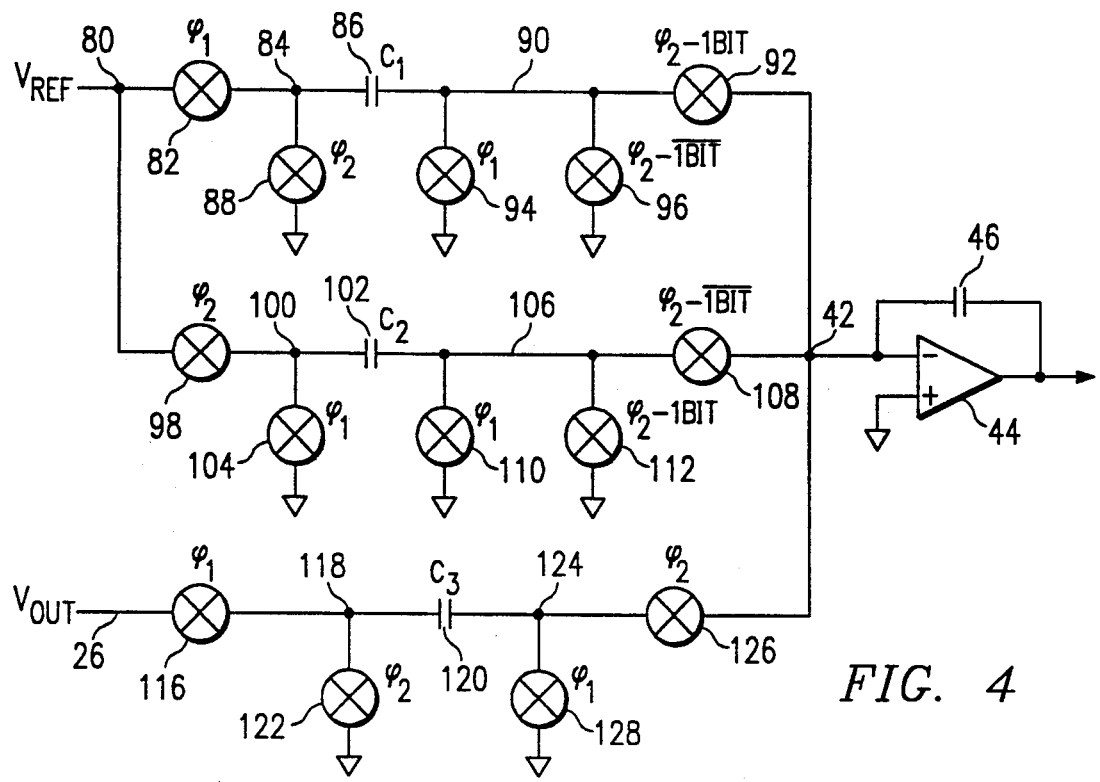
FIG. 4 illustrates a detailed logic diagram of the input stage of the switched-capacitor filter of FIG. 2.

Referring now to FIG. 1, there is illustrated an overall block diagram of a digital-to-analog converter (DAC) utilizing a low noise/low distortion switched-capacitor/continuous time filter. An n-bit digital input is received on the input of an interpolation filter 11, the output of which is input to a digital modulator 10 that is operable to convert the n-bit input to an m-bit digital output, m being less than n. In the preferred embodiment, the digital modulator 10 is comprised of an oversampling and noise shaping circuit utilizing a delta-sigma digital modulator that effectively converts the n-bit digital word to an m-bit digital output. In the preferred embodiment, m is equal to a value of "one". This is described in U.S. patent application Ser. No. 571,376, filed Aug. 22, 1990, and entitled "Phase Equalization System for a Digital-To-Analog Converter", which is incorporated herein by reference. However, it should be understood that a multi-bit output digital modulator could be utilized.

Although a delta-sigma modulator is utilized in the preferred embodiment, it should be understood that nay type of one-bit digital modulator or equivalent can e utilized to provide the conversion from an n-bit digital word to a one-bit digital stream. The delta-sigma modulator is utilized as it provides low level performance and differential non-linearity. The general operation of the digital modulator 10 is known in the art and described in Yasuykui Matsuia, Kuniharu Uchimura, Atsushi Awaiti and Takayo Kaneko, "A 17-Bit Oversampling D-To-A Conversion Technology Using Multi-Stage Noise Shaping", IEEE J. of Solid-State Circuits, Vol. 24, No. 4, Aug. 1989, which is incorporated herein by reference and V. Friedman, et al. "A Dual-Channel Voice-Band PCM Codec Using ΣΔ Modulation Technique", IEEE Journal of Solid State Circuits, Vol. 24, No. 2, Apr. 1989, which is incorporated herein by reference.

The one-bit digital stream output by the digital modulator 10 is input to a fourth order switched-capacitor low pass filter 12. The filter 12 is a Butterworth filter which has integral with the input thereof a one-bit DAC, as will be described hereinbelow. The output of the filter 12 is input to a switched-capacitor/continuous time buffer 14 that converts the switched-capacitor output o the filter 12 into a continuous time format with relatively low distortion. This is then input to a high impedance, low distortion unity gain buffer 16, the output of which is input to an active RC low-pass filter 18. The output of the active RC low-pass filter 18 provides the low impedance analog output of the overall digital-to-analog converter of FIG. 1.

Referring now to FIG. 2, there is illustrated a schematic block diagram of the switched-capacitor low-pass filter 12. The one-bit digital output of the delta-sigma modulator 10 is input to a one-bit DAC 20. The output of the one-bit DAC 20 is input to the positive input of a summing junction 22, the output of which is connected to a first stage of integration 24. The negative input of the summing junction 22 is connected to an output node 26 for the overall low-pass filter 12.

The output of the first stage of integration 24 is input to the positive input of a summing junction 28, the negative input of which is connected to the node 26. The output of summing junction 28 is input to a second stage of integration 30. The output of the second stage of integration 30 is input to the positive input of a summing junction 32. The negative input of summing junction 32 is connected to the output node 26. The output of summing junction 32 is connected to the input of a third stag of integration 34. The output of the third stage of integration 34 is input to the positive input of a summing junction 36. The negative input of the summing junction 36 is connected to the node 26. The output of the summing junction 36 is input to a fourth stage of integration 38, the output of which is connected to node 26.

In the preferred embodiment, the summing junctions 22, 28 and 32 have two positive inputs with the integration stage 34 being configured as inverting. This will provide an inverted output from integration stage 38. This is equivalent to the structure of FIG. 2.

The filter of FIG. 2 provides a fourth order Butterworth filter utilizing the switched-capacitor topology. By utilizing a switched-capacitor topology, the fabrication of the filter is more readily facilitated in present manufacturing environments. The use of a high order filter with a feedback path from the output stage back to the input stage provides for relatively low noise operation. The transfer function of the filter of FIG. 2 is as follows:

$$\frac{V_{OUT}}{V_{IN}} = \frac{ABCD}{S^4 + DS^3 + CDS^2 + BCDS + ABCD}$$

Referring now to FIG. 3, there is illustrated a more detailed block diagram of the filter of FIG. 2, illustrating the switched-capacitor topology. The one-bit digital signal input is input to a switched-capacitor/DAC block 40, the output of which is input to a summing node 42. The summing node 42 corresponds to the summing junction 22. The output of node 42 is input t the negative input of an amplifier 44, the positive input of which is connected to ground. A capacitor 46 is connected between the negative input of amplifier 44 and the output thereof. The output of amplifier 44 is input to a switched-capacitor block 48, the output of which is connected to a summing node 50. Summing node 50 corresponds to summing junction 28 and is input to the negative input of an amplifier 52. The positive input of amplifier 52 is connected to ground. A capacitor 54 is connected between the negative input of amplifier 52 and the output thereof. Amplifier 52 and capacitor 54 correspond to the second stage of integration 30.

The output of amplifier 52 is input to a switched-capacitor block 56, the output of which is connected to a summing node 58. The summing node 58 corresponds to a summing junction 32. Summing node 58 is input to the negative input of an amplifier 60, the positive input of which is connected to ground. A capacitor 62 is connected to the negative input of amplifier 60 and the output thereof. Amplifier 60 and capacitor 62 correspond to the third stage of integration 34. The output of amplifier 60 is input to a switched-capacitor block 64, the output of which is connected to a summing node 66 that corresponds to summing junction 36. Summing node 66 is input to the negative input of an amplifier 68, the positive input of which is connected to ground. A capacitor 70 is connected between the negative input of amplifier 68 and the output thereof. Amplifier 68 and capacitor 70 correspond to the fourth stage of integration 38. The output of amplifier 68 is connected to the output node 26.

The output node 26 is fed back to summing nodes 42, 50, 58 and 66 through switched-capacitor blocks 72, 74, 76 and 78, respectively. By feeding back the output of the last stage of integration from node 26 to the input of amplifier 44, the input stage 24 can now influence the output noise of the last stage of integration 38. Therefore, the gain of the first stage of integration 24, corresponding to amplifier 44 and capacitor 46, reduces the input-referred noise of all succeeding stages, including the output stage of integration 38. This results in a very low noise switched-capacitor filter.

The filter operates at a sampling rae of 3.072 MHz with a −3 dB bandwidth of 25 kHz, and the transfer function for the filter normalized to a $\frac{1}{2}\pi - 3$ dB bandwidth is:

$$\frac{V_{OUT}}{V_{IN}} = \frac{1}{S^4 + 2.613S^3 + 3.414S^2 + 2.613S + 1}$$

The capacitor values for the capacitors that are utilized is switched capacitor blocks 40, 48, 56, 64, 72, 74, 76, 78 and capacitors 46, 54, 62 and 70 are provided as corresponding to capacitor designations C1–C12. C1 corresponds to switched capacitor block 40, C2 to block 72, C3 to capacitor 46, C4 to block 48, C5 to block 74, C6 to capacitor 54, C7 to block 56, C8 to block 76, C9 to capacitor 62, C10 to block 64, C11 to block 78 and C12 to capacitor 70. The values of the capacitors C1–C12 are as follows:

| Capacitor | Value (pf) |
|---|---|
| C1 | 2.0 |
| C2 | 2.0 |
| C3 | 118.048 |
| C4 | 3.39 |
| C5 | 3.0 |
| C6 | 76.689 |
| C7 | 2.0 |
| C8 | 2.0 |
| C9 | 29.37 |
| C10 | 1.0 |
| C11 | 1.0 |
| C12 | 6.996 |

Referring now to FIG. 4, there is illustrated a detailed logic diagram of the switched-capacitor/DAC block 40, the switched-capacitor block 72 and the amplifier 44. A reference voltage is provided that is connected to a node 80, node 80 is connected through a switch 82 to a node 84. Node 84 is connected to one side of a capacitor 86 and also through a switch 88 to ground. The other side of capacitor 86 is connected to a node 90, node 90 connected through a switch 92 to the summing node 42. Node 90 is also connected to ground through a switch 94 and also to ground through a switch 96.

The switch 82 is controlled by a clock $\phi_1$, as is switch 94. Switch 88 is controlled by a clock $\phi_2$. Switch 96 is controlled by the AND logic function of the clock $\phi_2$ and the inverse of the single bit digital input "1BIT". The switch 92 is controlled by the AND function of the clock $\phi_2$ and the input "1BIT".

The reference voltage on node 80 is also input through a switch 98 to a node 100. Node 100 is connected to one side of a capacitor 102 and also to ground through a switch 104. The other side of capacitor 102 is connected to a node 106. Node 106 is connected through a switch 108 to the summing node 42 and also to ground through a switch 110 and to ground through a switch 112.

Switches 104 and 110 are controlled by the clock $\phi_1$ and switch 98 is controlled by the clock $\phi_2$. The switch 112 is controlled by the AND function of the clock signal $\phi_2$ and the input signal "1BIT". The switch 108 is controlled by the AND function of clock $\phi_2$ and the inverse of the input signal "1BIT". As the result of this switching scheme, the path associated with capacitor 86 is non-inverting and the path associated with capacitor 102 is inverting.

The output on node 26 is input through a switch 116 to a node 118. Node 118 is connected to one side of a capacitor 120 and also to ground through a switch 122. The other side of capacitor 120 is connected to a node 124. Node 124 is connected through a switch 126 to summing node 42 and also to ground through a switch 128. The switches 116, 122, 126 and 128 and the capacitor 120 comprise the switched-capacitor block 72. Switches 116 and 128 are clocked by the clock $\phi_1$ and switches 122 and 126 are clocked by clock $\phi_2$, thus resulting in a non-inverting topology, as described hereinabove. Additionally, the components that configure the switched-capacitor block 72 are similar to those that configure the switched-capacitor blocks 48, 56, 64, 74, 76 and 78, with different values for the capacitors therein with blocks 64 and 78 being configured in an inversion configuration. This is a conventional switched-capacitor configuration.

Figure 5:
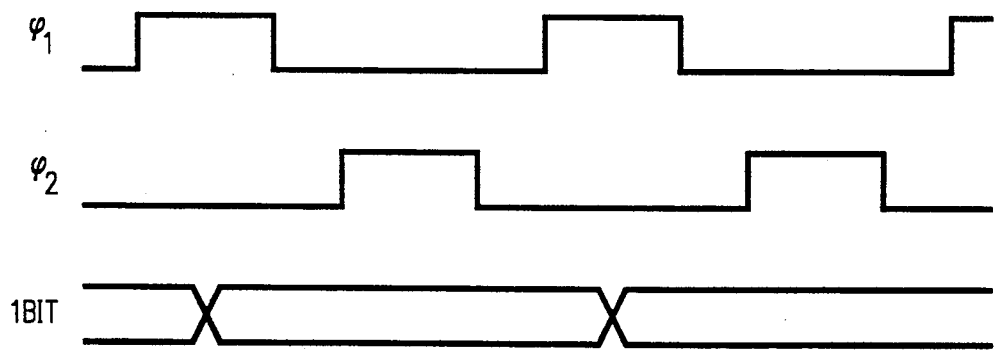
FIG. 5 illustrates a timing diagram for the one-bit DAC integrated into the input stage of the switched-capacitor filter.

Referring now to FIG. 5, there is illustrated a timing diagram for the operation of the clock signals $\phi_1$ and $\phi_2$ and the single bit input. When $\phi_1$ is high, switches 82 and 94 are closed, thus allowing the plate of capacitor 86 connected to node 84 to be charged to the reference voltage. When $\phi_2$ goes high, node 84 is pulled to ground and node 86 is connected to the summing node 42 only if the single bit digital input is at a logic "1", resulting in switch 92 closing. If not, switch 92 remains open, and switch 96 connects the node 90 to ground, discharging capacitor 86. The switches 108 and 112 operate in an opposite manner, such that for the opposite logic state on "1BIT", logic "1", the capacitor C2 is utilized to determine the voltage on the summing junction 42. Of course, at the same time that charge is transferred from the capacitor 86 or 102 to the summing junction 42, charge is also transferred from the capacitor 120 to summing junction 42. This is the feedback path that is utilized to allow the first stage of integration to reduce the noise on the output stage. This provides an overall fourth order Butterworth filter topology utilizing a one-bit DAC integrated in the input to the first stage of the filter.

The one of the capacitors 86 or 102 that is not being used is shorted to ground such that the charge across both capacitors 86 and 102 at the end of $\phi_2$ is substantially the same, regardless of whether charge was transferred to the virtual ground node 42 or not. Therefore, the reference voltage at node 80 provides the same amount of charge over all cycles, i.e., the charge supplied is substantially independent of the one-bit data pattern. To achieve a high signal-to-noise ratio, the voltage $V_{REF}$ must be substantially independent of the one-bit pattern.

Figure 6:
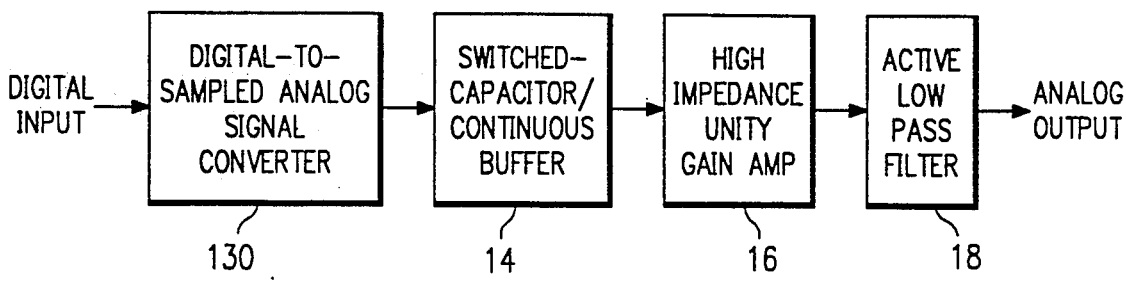
FIG. 6 illustrates a block diagram of the switched-capacitor/continuous time buffer.

Referring now to FIG. 6, there is illustrated a block diagram of the digital-to-analog converter illustrating the operation of the switched-capacitor/continuous time buffer 14. In general, the digital delta-sigma modulators 10 are incorporated in a digital-to-sampled analog signal converter 130. The output of this block 130 is the analog value of the digital input signal in the sampled data domain. This is then input to the switched capacitor/continuous time buffer 14 and converted to a continuous time analog signal with virtually no distortion added by the buffer 14. The unity gain amplifier 16 provides a high impedance for the operation of the buffer 14. The output of the amplifier 16 is then input to the active low-pass filter 18 that can drive a relatively low impedance output on the order of 600 Ohms.

Figure 7:
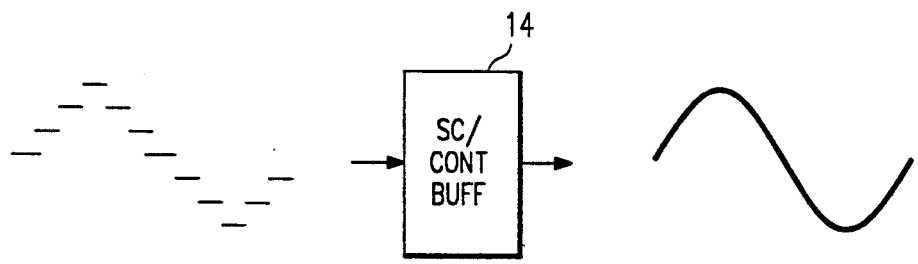
FIG. 7 illustrates a diagrammatic view of the conversion operation.

Referring now to FIG. 7, there is illustrated a diagrammatic view of the operation of the buffer 14. In the sampled data domain, each data sample is represented as a discrete step. For illustrative purposes, a sine wave has been chosen. The only important data point in the sampled time domain is at the end of the sampled data value, this being the point at which the data is valid. It is necessary to convert this data to a smooth analog waveform representing the output of the buffer 14. However, this conversion should be relatively distortion free, which can be difficult when the sampled data is generated with some slew, as the result of a less than ideal switched-capacitor filter. This is typically the type of signal that is presented. Further, if conventional buffer circuitry is utilized, this can further introduce slew into the sampled data domain, resulting in additional distortion when converted to the continuous time domain.

Figure 8:
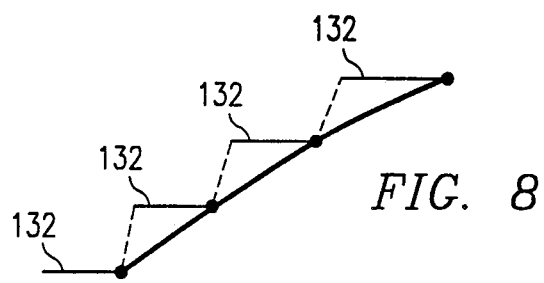
FIG. 8 illustrates the smoothing operation provided by the buffer of FIG. 7.

Referring now to FIG. 8, there is illustrated a diagrammatic view of the waveform of the sampled data. The sampled data is represented by a plurality of discrete steps 132. At the end of each of the steps 1323 is the valid analog data for value. It is necessary to interconnect these points in such a manner that no distortion results.

Figure 9:
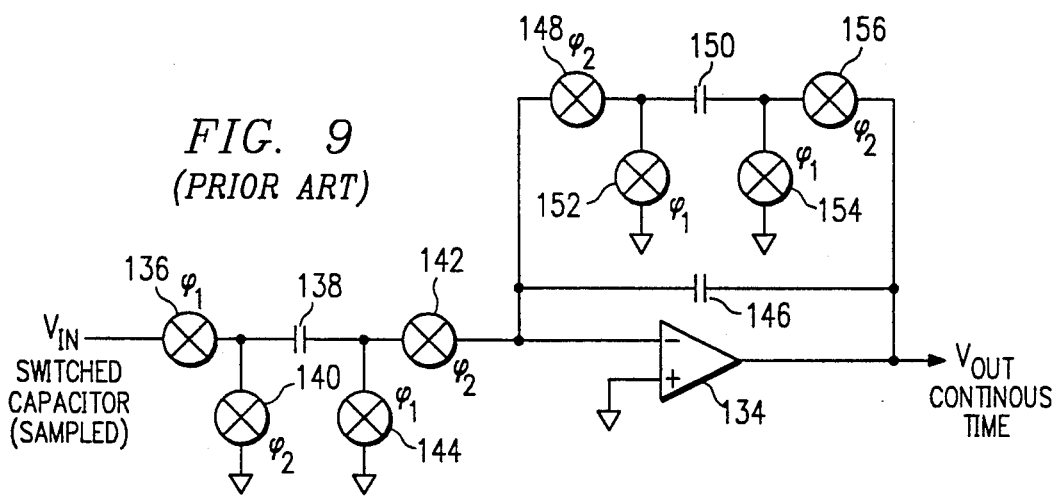
FIG. 9 illustrates a prior art buffer for receiving on the input the sampled data from the output of a switched capacitor filter and converting this to a continuous time analog input to an active filter.

Referring now to FIG. 9, there is illustrated a prior art parasitic-insensitive, non-inverting, first order switched-capacitor low pass filter. An amplifier 134 is provided having the positive input thereof connected to ground. A switched-capacitor (sampled) input voltage is input to one side of a switch 136, the other side of which is connected to one side of a capacitor 138. The one side of the capacitor 138 is also connected to ground through a switch 140. The other side of capacitor 138 is connected to one side of a switch 142, the other side of which is connected to the negative input of the amplifier 134. The other side of the capacitor 138 is also connected t ground through a switch 144. Switches 136 and 144 are controlled by the clock signal $\phi 1$ and the switches 140 and 142 are controlled by the clock signal $\phi 2$.

A feedback circuit is provided with a feedback capacitor 146 connected between the negative input of amplifier 134 and the output thereof. The negative input of amplifier 134 is also connected to one side of a switch 148, the other side of which is connected to one side of a capacitor 150. The one side of capacitor 150 is also connected to ground through a switch 152. The other side of capacitor 150 is connected to ground through a switch 154 and also to one side of a switch 156. The other side of the switch 156 is connected to the output of amplifier 134. Switches 152 and 154 are controlled by the clock signal $\phi 1$ and switches 148 and 156 are controlled by the clock signal $\phi 2$.

Assuming that the filter illustrated in FIG. 9 is configured for a unity low frequency gain (i.e., the input sampling capacitor 138 being equal in value to the switched feedback capacitor 150), the transfer function in the z-domain is as follows:

$$\frac{V_{OUT}}{V_{IN}} = \frac{C_{IN} z^{-1}}{C_{IN} + C_F(1 - z^{-1})}$$

After the filter has reached steady state with the DC input, the output will have settled to the DC input vale just before a sampling event occurs. With equal value switched-capacitors and the output voltage equal to the input voltage, which is equal to the DC voltage, this sampling vent will not disturb the charge on the unswitched feedback capacitor 146. However, it will require the amplifier 134 to provide an output that delivers the charge demanded by the voltage polarity change on the series capacitance of capacitors 138 and 150, with capacitor 150 being substantially equal in value to capacitor 138. This charge demand can temporarily drive the amplifier 134 into non-linear settling behavior, which can be observed as distortion through subsequent continuous-time blocks.

Figure 10:
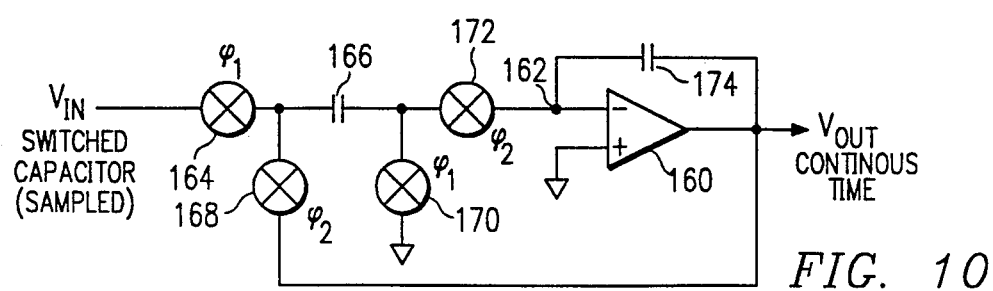
FIG. 10 illustrates a logic diagram of the switched-capacitor/continuous time buffer for the DAC.

Referring now to FIG. 10, there is illustrated a schematic diagram of the switched-capacitor, continuous time buffer of the present invention. An amplifier 160 is provided having the positive input hereof connected to ground. The negative input thereof is connected to an input node 162. A switched capacitor (sampled) input voltage is received on one side of the switch 164, the other side of which is connected to one side of the capacitor 166. The one side of the capacitor 166 is also connected through a switch 168 to the output of the amplifier 160. The other side of the capacitor 166 is connected to ground through a switch 170 and also through a switch 172 to the input node 162. A feedback capacitor 174 is connected between the input node 162 and the output of amplifier 160.

In operation, the buffer of FIG. 10 avoids the potential distortion mechanism described above with reference to FIG. 9 by alleviating the amplifier 160 from charge demand during low-frequency, steady state operation. A single input capacitor, capacitor 166, is switched directly between the input and output, so that when the output voltage is equal to the input voltage, when the input voltage is equal to a relatively low frequency voltage such as DC, there is no net voltage change on any capacitor. Therefore, no charge demand is made on the amplifier output 160. As such, relatively low distortion results. This is enhanced due to the fact that it is driving a high impedance load in the form of the unity gain buffer 16.

Figure 11:
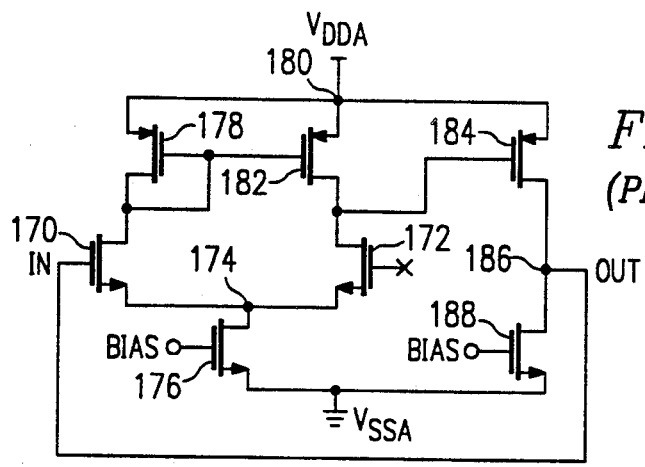
FIG. 11 illustrates a schematic diagram of a prior art unity gain buffer.

Referring now to FIG. 11, there is illustrated a schematic diagram of a prior art unity gain buffer. Two differential input transistors 170 and 172 are provided, having the sources thereof connected to a common node 174. The node 174 is connected through the source/drain path of an N-channel transistor 176 to a supply voltage $V_{SS4}$. The gate thereof is connected to a bias voltage, transistor 176 acting as a current source. The drain of transistor 170 is connected to one side of the source/drain path of a P-channel transistor 178, the other side of which is connected to a positive supply voltage $V_{DD4}$ on a node 180. The gate and drain of transistor 178 are connected together. In a similar manner, the drain of transistor 172 is connected to one side of the source/drain path of a transistor 182, the other side of which is connected to the node 180. The gate of transistor 182 is connected to the gate of transistor 178. The gate of transistor 170 comprises the negative input and the gate of transistor 172 comprises the positive input, the drain of transistor 172 also providing the output of the differential amplifier which is connected to the gate of an output driver transistor 184, which is a P-channel transistor, which has one side of the source/drain path thereof connected to node 180 and the other side thereof connected to an output node 186. The output node 186 is connected back to the gate of transistor 170, which is the input of the amplifier. A current source transistor 188 is provided, having the source/drain path thereof connected between node 186 and the voltage $V_{SS4}$. The gate of transistor 188 is connected to a bias voltage.

A large common mode signal at the differential pair input, transistors 170 and 172, of the prior art amplifier of FIG. 11, introduces two distortion mechanisms. The first is due to the large signal change in the drain-to-source voltage ($V_{DS}$) of the differential pair devices 170 and 172. If there is a mismatch in the $I_D$ vs. $V_{DS}$ or output conductance characteristics of these devices, a difference in the gate-to-source voltage $V_{GS}$ of these devices must be introduced in order to maintain equal drain currents ($I_D$). This $V_{GS}$ difference can manifest itself as distortion in the buffer input/output characteristics. The second distortion mechanism present in the prior art amplifier/buffer under large, common-mode signal conditions is due to the large signal change in the drain-to-source voltage of the current source transistor 176. Because of the finite output impedance of transistor 176, the $V_{DS}$ change of transistor 176 will cause the differential pair bias current to vary with input signal. If there is a mismatch in the $I_D$ vs. $V_{GS}$ or transconductance characteristics of the differential pair devices, a difference in the gate-to-source voltage of these devices must again be introduced in order to maintain an equal current balance. It is important to point out, since both of these distortion mechanisms occur at the amplifier differential input stage, no amount of open loop amplifier gain will reduce these effects during closed loop operations.

Figure 12:
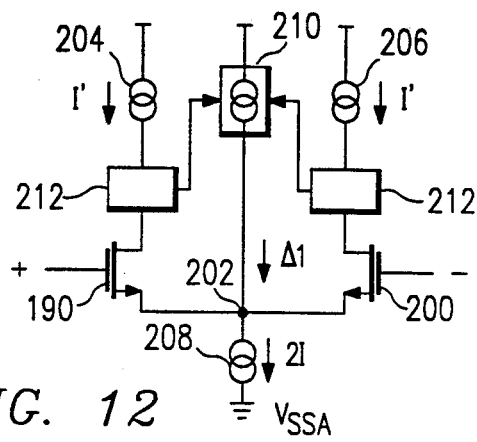
FIG. 12 illustrates a simplified schematic diagram of the unity gain buffer.

Referring now to FIG. 12, there is illustrated a simplified schematic diagram of the unity gain buffer for the DAC. Two differential input devices 190 and 200 are provided, both N-channel devices having the sources thereof connected to a common node 202. The gate of transistor 190 is a positive input of the buffer and the gate of transistor 200 is a negative input. A current source 204 is connected to the rain of transistor 190 to provide a current I'. Similarly, a current source 206 is connected to the drain of transistor 200 and provides an equal current I'. A current source 208 is connected between the common node 202 and the supply voltage $V_{SSA}$ and provides a current sink of 2I. Another current source, current source 210 is provided that is connected directly to the node 202 to provide a current $\Delta I$. The current source 210 is controlled by two control boxes 212 that are disposed between the respective drains of transistors 190 and 200 and the respective current sources 204 and 206 to sense the currents therethrough. Control boxes 212 control current source 210 to adjust the value of $\Delta I$ to maintain the current through transistors 190 and 200 at a constant $I_D$ independent o current variations in current source 208. Therefore, the input differential pair of transistors 190 and 200 are operated in a constant $I_D$ mode, even under large input common-mode signal conditions. The current sources 204 and 206 are operable to force equal drain currents in the two transistors 190 and 200, while the current source 210 is operable to absorb the current difference at the common node 202.

Figure 13:
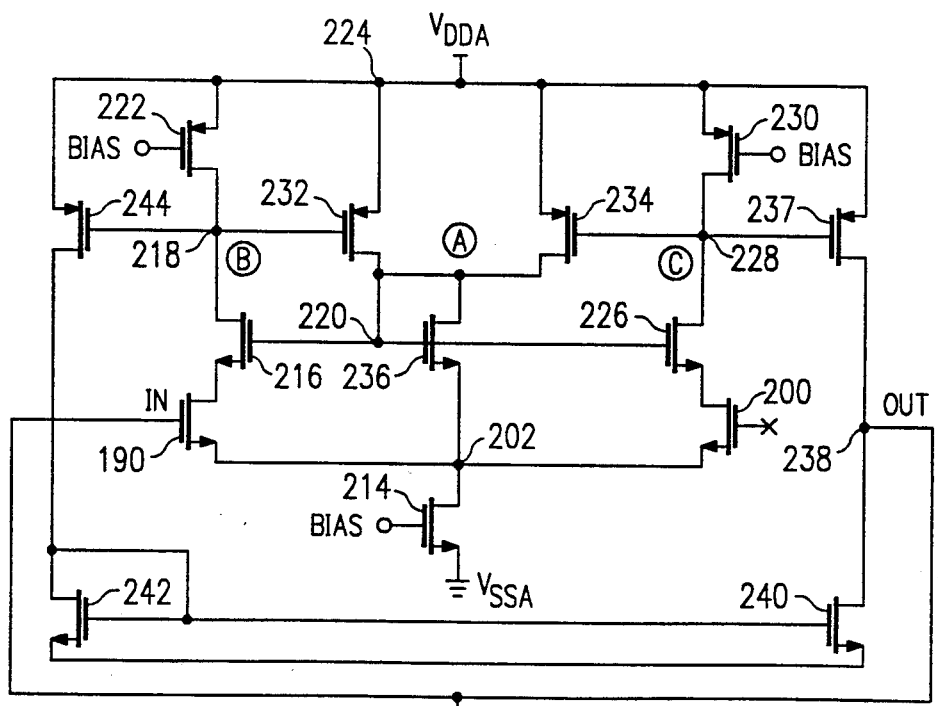
FIG. 13 illustrates a detailed schematic diagram of the unity gain buffer.

Referring now to FIG. 13, there is illustrated a more detailed schematic diagram of the unity gain buffer for the DAC. The common source node 202 is connected to one side of the source/drain path of a transistor 214, the other side of which is connected to $V_{SSA}$. Transistor 214 corresponds to current source 208. The gate thereof is connected to a bias voltage. The drain of transistor 190 is connected through the source/drain path of a cascode N-channel transistor 216 to a node 218; The gate of transistor 216 is connected to a dynamic bias node 220. Node 218 is connected to one side of the source/drain path of a P-channel transistor 222, the other side of which is connected to a supply node 224, which is connected to $V_{DDA}$. The gate of transistor 222 is connected to a bias voltage and functions as current source 204. In a similar manner, the drain of transistor 200 is connected through the source/drain path of an N-channel cascode transistor 226 to a node 228. The gate of transistor 226 is connected to the node 220. Node 228 is connected to one side of the source/drain path of a P-channel transistor 230, the other side of which is connected to the node 224. The gate of transistor 230 is connected to a bias voltage, transistor 230 functioning as current source 206.

A P-channel feedback transistor 232 has one side of the source/drain path thereof connected to node 224 and the other side thereof connected to node 220. The gate of transistor 232 is connected to node 218. Similarly, a P-channel feedback transistor 234 has one side of the source/drain path thereof connected to the node 224 and the other side thereof connected to the node 220. The gate of transistor 234 is connected to node 228. An N-channel transistor 236 is provided having the drain and gate thereof connected together and to node 220 and the source thereof connected to node 202 to provide the current $\Delta I$ to node 202 and also provide the dynamic gate bias for transistors 216 and 226.

The node 228 is connected to the gate of the P-channel transistor 237, the source/drain path thereof connected between the node 224 and an output node 238. Similarly, node 238 is connected to one side of the source/drain path of an N-channel transistor 240, the other side of which is connected to $V_{SSA}$. The gate of transistor 240 is connected to the gate of a second N-channel transistor 242, the gate and drain thereof connected together and the source connected to $V_{SSA}$ to function as a current mirror. The gate-drain of transistor 242 is connected to one side of the source/drain path of a P-channel transistor 244, the other side thereof connected to the node 224. The gate of transistor 244 is connected to node 218. Transistors 237, 240, 242 and 244 function as the second stage of amplification to provide a general turn-around output stage. The transistors 240 and 242 are just a current mirror whereas transistors 237 and 244 provide the actual output stage, this structure being a two-stage amplifier. The output node 238 is connected to the gate of transistor 190, which constitutes the input o the amplifier.

In operation, the $\Delta I$ current is controlled by transistors 232 and 234 which provide the feedback operation. The transistors 216 and 226 are cascode devices with transistor 236 being a bias device. The transistors 216 and 226 ensure a constant differential pair $V_{DS}$ under large input, common-mode signal conditions. The shunt feedback transistors 232 and 234 are operable to absorb the current difference at the common source node 202. As the bias current in the transistor 214 changes due to finite output impedance, the gate-to-source voltage of the feedback transistors 232 and 234 will change to accommodate this current change, but the $V_{GS}$ change in transistors 232 and 234 will be lower by a factor of (gm/go)>>1 (gm=transconductance of shunt feedback devices 232 and 234; go=output conductance of current source transistor 214). Consequently, the current source devices that really determine the input paired bias current of transistors 19 and 200 experience a $V_{DS}$ change substantially lower than the input common-mode signal.

Figure 14:
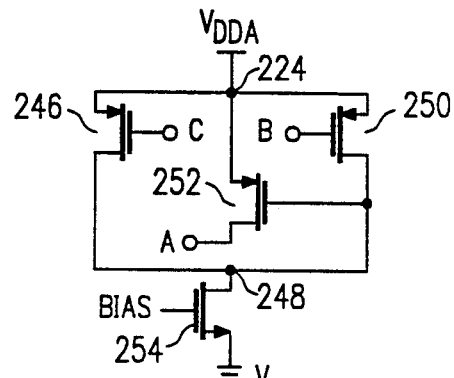
FIG. 14 illustrates a schematic of the start-up circuit for the unity gain buffer.

Referring now to FIG. 14, there is illustrated a start-up circuit for the buffer of FIG. 13. In FIG. 13, the node 218 is labelled "B", node 220 is labelled "A", and node 228 is labelled "C". A P-channel transistor 246 has the source/drain path thereof connected between the node 224 and a node 248. The gate of transistor 246 is connected to the connection "C" at node 220. A P-channel transistor 250 has the source/drain path thereof connected between the node 224 and node 248 and the gate thereof connected to connection "B" at node 218. A P-channel transistor 252 has the source/drain path thereof connected between node 224 and the connection "A" at node 228 and the gate thereof connected to the node 248. A transistor 254 has the source/drain path thereof connected between node 248 and $V_{SSA}$ and the gate thereof connected to a bias current. The circuit of FIG. 14 is operable to provide start-up current to node "A" upon initialization.

Figure 15:
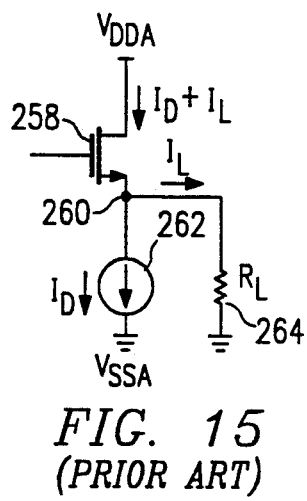
FIG. 15 illustrates a schematic diagram of a prior art output stage for a DAC.

Referring now to FIG. 15, there is illustrated a schematic diagram of the output stage of an op amp utilized in conventional active filters for digital-to-analog converters. An N-channel source follower transistor 258 has the source/drain path thereof connected between the voltage $V_{DDA}$ and a node 260. Node 260 is connected to a low voltage reference with a current source 262. Node 260 comprises the output node which is connected to ground through a resistor 264, which is the load resistor. The current flowing through the resistor 264 and $I_L$ and the current flowing through the transistor 258 is the sum of the drain current $I_D$ and the load current $I_L$.

In the prior art circuit of FIG. 15, the signal dependent load current $I_L$ causes the current in the source follower transistor 258 to vary. The result is a square law variation in the $V_{GS}$ of this device, which translates to distortion in the $V_{out}/V_{in}$ transfer characteristics. Furthermore, the standard source follower operates in Class A mode, which means that the DC current source $I_D$ must be at least as large as the maximum intended load current.

Figure 16:
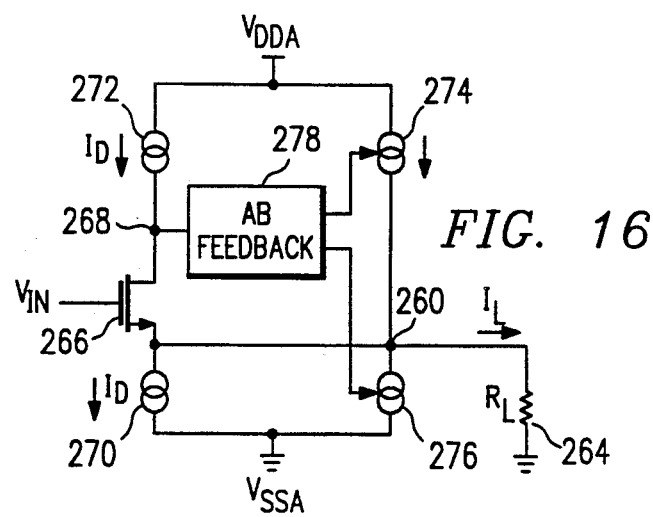
FIG. 16 illustrates a simplified schematic diagram of the output state of the DAC.

Referring now to FIG. 16, there is illustrated a simplified schematic diagram of the output stage of the active RC low pass filter 18 for the DAC. A source follower N-channel transistor 266 has the source/drain path thereof connected between a node 268 and the node 260, the source thereof connected to the node 260. The gate of transistor 266 receives the input voltage to the output stage. A constant current source 270 is connected between node 260 and the voltage $V_{SSA}$, and the constant current source 272 is connected between the node 268 and the positive voltage $V_{DDA}$. The current through current sources 170 and 272 is equal to the drain current $I_D$ through transistor 266, and this is maintained constant and independent of the load current $I_L$. A variable current source 274 is connected between $V_{DDA}$ and the node 260 and the variable current source 276 is connected between the node 260 and the voltage $V_{SSA}$. Current source 274 is operable to supply current to the load resistor 264 for high voltage swings on node 260 and the current source 276 is operable to sink current from load resistor 264 for low voltage or negative signal swings. The current sources 274 and 276 are controlled by a feedback circuit 278 that is operable to generate a Class AB feedback which is controlled by the voltage on node 268. Therefore, load current is provided by current sources 274 and 276, current sources 274 and 276 sourcing/sinking more load current $I_L$ than the operating bias currents.

In operation, the source follower transistor 266 is operated in the constant current mode. The drain current is forced to be load-independent by the current source 272. Since the drain current of N-channel transistor 266 is constant, the gate-to-source voltage is load independent, and a distortion-free voltage is delivered to the load resistor 264. The current $I_L$ demanded by the load resistor 264 is supplied by the current sources 274 and 276. Class AB operation is provided by the AB feedback network 278, which is controlled by the voltage on node 268.

Figure 17:
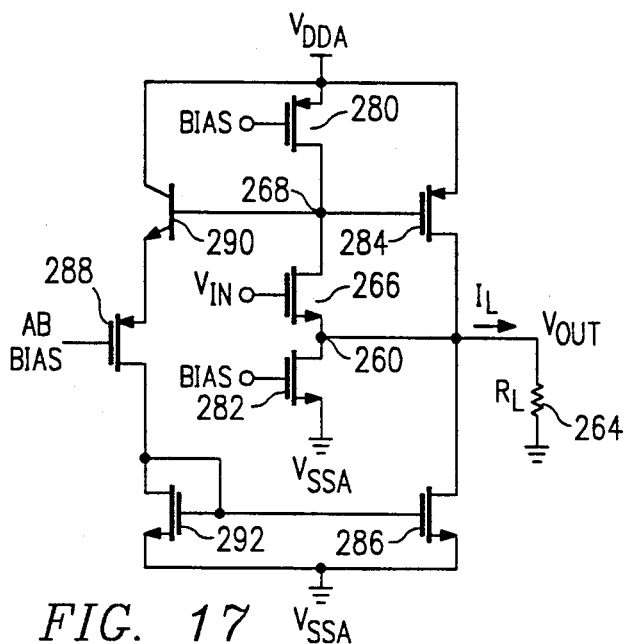
FIG. 17 illustrates a detailed schematic diagram of the output stage of the DAC.

Referring now to FIG. 17, there is illustrated a more detailed schematic diagram of the output stage of FIG. 16. The current source 272 is realized with a P-channel transistor 280 having the source/drain path thereof connected between the node $V_{DDA}$ and the node 268. Similarly, the current source 270 is realized with an N-channel transistor 282, having the source/drain path thereof connected between node 260 and the voltage $V_{SSA}$. The gates of transistors 280 and 282 are connected to separate bias voltages.

The current source 274 is realized with a P-channel transistor 284, having the source/drain path thereof connected between the $V_{DDA}$ node and the node 260, the gate of transistor 284 connected to node 268. The current source 276 is realized with an N-channel transistor 286, the source/drain path thereof connected between the node 260 and the voltage $V_{SSA}$. Transistor 286 is controlled by a current mirror operation.

The feedback network is comprised of a P-channel transistor 288 having the source/drain path thereof connected between the emitter of an NPN bi-polar transistor 290 and the drain of an N-channel transistor 292. Transistor 292 has the gate and drain thereof connected together and to the gate of transistor 286 and the source thereof connected to $V_{SSA}$ to provide the other side of the current mirror. The gate of transistor 288 is connected to an external AB Bias signal. The base of transistor 290 is connected to node 268 and the collector thereof is connected to $V_{DDA}$.

In operation, class AB operation is provided by the transistor 288 and the bi-polar transistor 290, which transistor 290 provides a low impedance control of the source of transistor 288. The bi-polar transistor is utilized in lieu of an N-channel transistor, due to the larger transconductance, with no back-gate problems presented thereby. Bias current in transistors 284 and 286 is controlled by the AB Bias signal, which provides the gate bias for transistor 288. Signal operation is based on feedback control of the gate potential on the transistor 284 through the voltage on node 268. As the gate potential of transistor 284 decreases, current through transistor 284 increases to supply current to the load resistor 264. At the same time, the $V_{GS}$ of transistor 288 decreases, which decreases the current in the mirrored transistors 286 and 292. As the gate potential of transistor 284 at node 268 increases, the current in transistor 284 decreases while the current through transistor 288 and the mirrored transistors 286 and 292 increases to sink load current. Note that the operation is class AB, since transistors 284 and 286 can source/sink more load current $I_L$ than their operating bias current.

Figure 18:
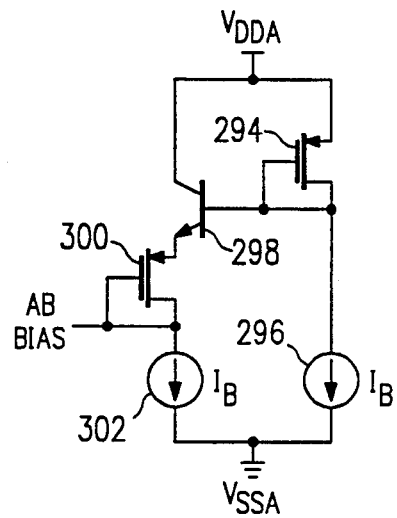
FIG. 18 illustrates a schematic diagram of one embodiment of the bias circuitry for generating the AB bias for the output stage.

Referring now to FIG. 18, there is illustrated a schematic diagram of one embodiment of the circuit to generate the AB Bias signal. A P-channel transistor 294 has the source/drain path thereof connected between the node $V_{DDA}$ and one side of a current source 296. The other side of current source 296 is connected to the node $V_{SSA}$, current source 296 having a current $I_B$ flowing therethrough. A bi-polar transistor 298 has the collector thereof connected to $V_{DDA}$ and the emitter thereof connected to the source of the P-channel transistor 300. The base of transistor 298 is connected to the gate and drain of transistor 294. The gate and drain of transistor 300 are connected together and to one side of the current source 302, the other side of which is connected to the $V_{SSA}$ node. Current source 302 carries the current $I_B$. The circuit of FIG. 18 provides an idling current in the signal path of transistors 284 and 286 that is proportional to the current $I_B$ in accordance with the following relationship:

$$\frac{\left(\frac{Z}{L}\right)_{Xter\,284}}{\left(\frac{Z}{L}\right)_{Xter\,294}} \times I_B$$

Figure 19:
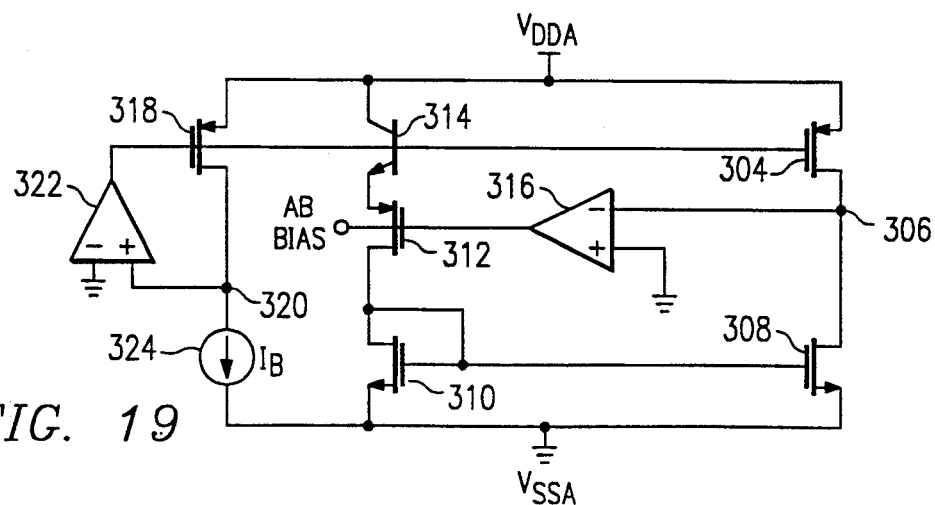
FIG. 19 illustrates an alternate embodiment for generating the AB bias.

Referring now to FIG. 19, there is illustrated an alternate embodiment of the bias circuit for providing the AB Bias. A P-channel transistor 304 has the source/drain path thereof connected between the $V_{DDA}$ node and a node 306. Node 306 is connected to the $V_{SSA}$ node through the source/drain path of an N-channel transistor 308. The gate of transistor 308 is connected in a current mirror configuration to the gate and drain of an N-channel transistor 310, the source thereof connected to the $V_{SSA}$ node. The drain of transistor 310 is connected to the drain of a P-channel transistor 312, the source of which is connected to the emitter of a bi-polar transistor 314, the base of which is connected to the gate of transistor 304. The collector of transistor 314 is connected to the $V_{DDA}$. The gate of transistor 312 is connected to the output of an operational amplifier 316. Amplifier 316 has the negative input thereof connected to node 306 and the positive input thereof connected to ground. A P-channel transistor 318 has the source/drain path thereof connected between the $V_{DDA}$ node and a node 320. The gate of transistor 318 is connected to the output of an operational amplifier 322, the positive input of which is connected to the node 320 and the negative input of which is connected to ground. Node 320 is connected to a voltage $V_{SSA}$ through a current source 324 that has a current $I_B$ flowing therethrough. In this circuit, all of the ratioed bias currents are established in devices that operate with the same $V_{GS}$ and $V_{DS}$ as the corresponding devices in the signal path.

In summary, there has been provided a high order switched-capacitor filter that provides low noise operation for use with a one-bit digital string. The switched-capacitor filter utilizes an integral one-bit DAC on the input thereof. The output of the higher order output stage in the filter is fed back to the input through a switched-capacitor block to allow the first stage to decrease the noise in the output stage. This provides an overall noise shaping for the entire high order switched-capacitor filter.

Although the preferred embodiment has been described in detail, it should be understood that various changes, substitutions and alterations can be made therein without departing from the spirit and scope of the invention as defined by the appended claims.

What is claimed is:

1. A digital-to-analog converter, comprising:
   a digital portion for receiving an n-bit digital word and converting said n-bit digital word to a one-bit digital stream representative of the value of said n-bit digital word;
   a one bit digital-to-analog converter for receiving the one-bit digital stream and converting it to an analog value, said one-bit digital-to-analog converter including two switched capacitors; and
   an analog portion for receiving and filtering the output of said one-bit digital-to-analog converter, said analog portion including a switched-capacitor filter having greater than two stages of integration with the noise generated by at least a succeeding stage above order two being influenced by the input stage to said switched-capacitor filter, said one-bit digital-to-analog converter integral with the input stage of said switched capacitor filter.

2. The digital-to-analog converter of claim 1, wherein said digital portion includes a delta-sigma digital modulator for outputting the one-bit digital stream with a one's density proportional to said digital word.

3. The digital-to-analog converter of claim 1, wherein siad two switched-capacitors operate from a single reference voltage with one of said switched-capacitors being switched during one logic state of the one-bit data pattern and the other of said switched-capacitors being switched during the other logic state of the one-bit data pattern wherein the charge output by said single reference voltage is substantially independent of the input one-bit data pattern.

4. A digital-to-analog converter, comprising:
   a digital portion for receiving an n-bit digital word and converting said n-bit digital word to a one-bit digital stream representative of the value of said n-bit digital word;
   a one-bit digital-to-analog converter for receiving the one-bit digital stream and converting it to an analog value, said one-bit digital-to-analog converter including two switched-capacitors, said two switched-capacitors operating from a single reference voltage with one of said switched-capacitors being switched during one logic state of the one-bit data pattern and the other of said switched-capacitors being switched during the other logic state of the one-bit data pattern wherein the charge output by said single reference voltage is substantially independent of the input one-bit data pattern; and
   an analog portion incorporating said one-bit digital-to-analog converter and filtering the output thereof, said analog portion including a switched-capacitor filter having greater than two stages of integration with the noise generated by at least a succeeding stage above order two being influenced by the input stage to siad switched-capacitor filter;
   wherein the one of said two switched-capacitors not being used has the charge thereon discharged to a charge level substantially similar to the charge level that wold have been present if it were used during a conversion cycle.

5. A digital-to-analog converter, comprising:
   a digital portion for receiving an n-bit digital word and converting said n-bit digital word to an m-bit digital stream representative of the value of said n-bit digital word;
   an m-bit digital-to-analog converter for receiving the m-bit digital stream and converting it to an analog value; and an analog portion for receiving and filtering the output of said m-bit digital-to-analog converter, said analog portion including a switched-capacitor filter having greater than two stages of integration with the noise generated by at least a succeeding stage above order two being influenced by the input stage to said switched-capacitor filter;

said switched-capacitor filter including four stages of integration with the output of said fourth stage of integration summed with the input of said first stage such that said first stage reduces the noise (output) generated by said fourth stage of integration.

6. The digital-to-analog converter of claim 5, wherein the output of said fourth stage of integration is summed with each of the succeeding stages to said input stage.

7. A digital-to-analog converter, comprising:
a delta-sigma digital modulator for receiving a digital input value and converting it to a one-bit digital stream having a one's density proportional to siad digital value;
a low pass switched-capacitor filter for receiving said one-bit digital stream output by said delta-sigma modulator and converting the one-bit digital stream to an analog value and filtering said analog value to provide a switched-capacitor analog output, said switched-capacitor filter having greater than two stages of integration with the noise of at least a succeeding stage above order two having the noise generated thereby influenced by the input stage to said switched-capacitor filter;
said switched-capacitor filter including four stages of integration with the output of said fourth stage summed with the input of said first stage such that siad first stage reduces the noise generated by said fourth stage; and
an output low pass filter for converting the output of said switched-capacitor filter to a filtered analog output signal to provide a low impedance output.

8. The digital-to-analog converter of claim 7, wherein the output of said fourth stage is summed with each of the succeeding stages to said input stage.

9. The digital-to-analog converter of claim 7, wherein the input stage is operable to reduce the noise generated by at least one stage above order two in said switched-capacitor filter.

10. A digital-to-analog convertor, comprising:
a reference voltage;
a one-bit digital input for receiving a one-bit input data pattern;
a charge/discharge node; and
a switching network having two switched-capacitors that are switched to transfer charge from said reference voltage to said charge/discharge node in accordance with a predetermined switching pattern in such a manner as to maintain a substantially constant load on said reference voltage independent of the one-bit data pattern;
said switched-capacitors operating from a single reference voltage with one of said switched-capacitors being switched during one logic state of the one-bit data pattern and the other of said switched-capacitors being switched during the other logic state of the one-bit data pattern wherein the charge output by said reference voltage is substantially independent of the one-bit data pattern.

11. The digital-to-analog convertor of claim 10 wherein the one of said two switched-capacitors not being used has the charge thereon being charged to a charge level substantially similar to the charge level that would have been present if it were used during a conversion cycle.

12. A method for converting a digital value to an analog value, comprising:
converting an n-bit digital word to an m-bit digital stream having a value proportional to the n-bit digital value, m being less than ;
converting the m-bit digital stream to an analog value;
filtering the analog value with a switched-capacitor filter having four stages of integration; and
influencing the noise generated by at least a succeeding stage above order two in the switched-capacitor filter by summing the output of the fourth stage of integration with the input of the first stage of integration such that the first stage of integration reduces the noise generated by the fourth stage of integration.

13. The method of claim 12, wherein the step of converting the m-bit digital stream to an analog value comprises processing the m-bit digital stream through a an m-bit digital-to-analog converter, the digital-to-analog converter being integral with the first stage of the switched-capacitor filter.

14. The method of claim 12, and further comprising summing the output of the fourth stage of integration with each of the succeeding stages to the input stage of integration.

15. The method of claim 12, wherein the switched-capacitor filter is a fourth order Butterworth filter.

16. The method of claim 12, wherein m is equal to one.

17. A method for converting a digital signal to an analog signal, comprising the steps of:
providing a reference voltage;
providing an one-bit input;
receiving an one-bit data pattern on the one-bit input;
providing a charge/discharge node;
providing a switching network having two switched-capacitors;
charging the one of the two switched-capacitors not being used to a charge level substantially similar to the charge level that would have been present if it were used during a conversion cycle period; and
switching the switched-capacitors to transfer charge from the reference voltage to the charge/discharge node in accordance with a predetermined switching pattern in such a manner as to maintain a substantially constant load on the reference voltage independent of the one-bit data pattern.

18. The method of claim 17 wherein the step of switching the plurality of the switched-capacitors to transfer charge from the reference voltage comprises:
switching one of the two switched-capacitors during one logic of the one-bit data pattern; and
switching the other of the switched-capacitors during the other logic state of the one-bit data pattern;
wherein the charge supplied by the reference voltage is substantially independent of the one-bit data pattern.

* * * * *